US012633918B2

(12) United States Patent
Janisch et al.

(10) Patent No.: US 12,633,918 B2
(45) Date of Patent: May 19, 2026

(54) CIRCUIT ASSEMBLY, METHOD THEREOF AND APPARATUS

(71) Applicant: Renesas Electronics America Inc., Milpitas, CA (US)

(72) Inventors: Josef Janisch, Ilz (AT); Simon Hoefler, Ilz (AT)

(73) Assignee: Renesas Electronics America Inc., Milpitas, CA (US)

( * ) Notice: Subject to any disclaimer, the term of this patent is extended or adjusted under 35 U.S.C. 154(b) by 209 days.

(21) Appl. No.: 18/653,337

(22) Filed: May 2, 2024

(65) Prior Publication Data

US 2025/0343546 A1 Nov. 6, 2025

(51) Int. Cl.
*H03K 17/80* (2006.01)
*G01D 5/20* (2006.01)
*H03K 17/95* (2006.01)
(52) U.S. Cl.
CPC ............. *H03K 17/952* (2013.01); *G01D 5/20* (2013.01); *H03K 17/80* (2013.01)
(58) Field of Classification Search
CPC ........ H03K 17/51; H03K 17/80; H03K 17/95; H03K 17/952; G01D 5/14; G01D 5/20
See application file for complete search history.

(56) References Cited

U.S. PATENT DOCUMENTS

| | | | |
|---|---|---|---|
| 2015/0035519 A1* | 2/2015 | Buelau | G01D 5/2291 324/207.18 |
| 2018/0091145 A1* | 3/2018 | Dey, IV | B25F 5/00 |
| 2024/0295415 A1* | 9/2024 | Bruwer | G01D 5/20 |

* cited by examiner

*Primary Examiner* — Douglas X Rodriguez
*Assistant Examiner* — Kendrick X Liu
(74) *Attorney, Agent, or Firm* — SCULLY, SCOTT, MURPHY & PRESSER, P.C.

(57) ABSTRACT

A circuit assembly is provided. The circuit assembly has a transmitter coil and multiple receiver coils for receiving signals induced by a magnetic field generated by the transmitter coil, and also has one or more movable metallic targets for influencing the signals picked up by the receiver coils. The receiver coils has a first receiver coil which is a sine-signal-output receiver coil and a second receiver coil which is a cosine-signal-output receiver coil. The transmitter coil and the first and second receiver coils are displaced from each other to have an open area in which the transmitter coil is present but not the first and second receiver coils, the open area having a predetermined range along a movement path of a first target, such that when the first target moves within the predetermined range, the circuit assembly is operable in a first mode as a low power on-off switch.

15 Claims, 12 Drawing Sheets

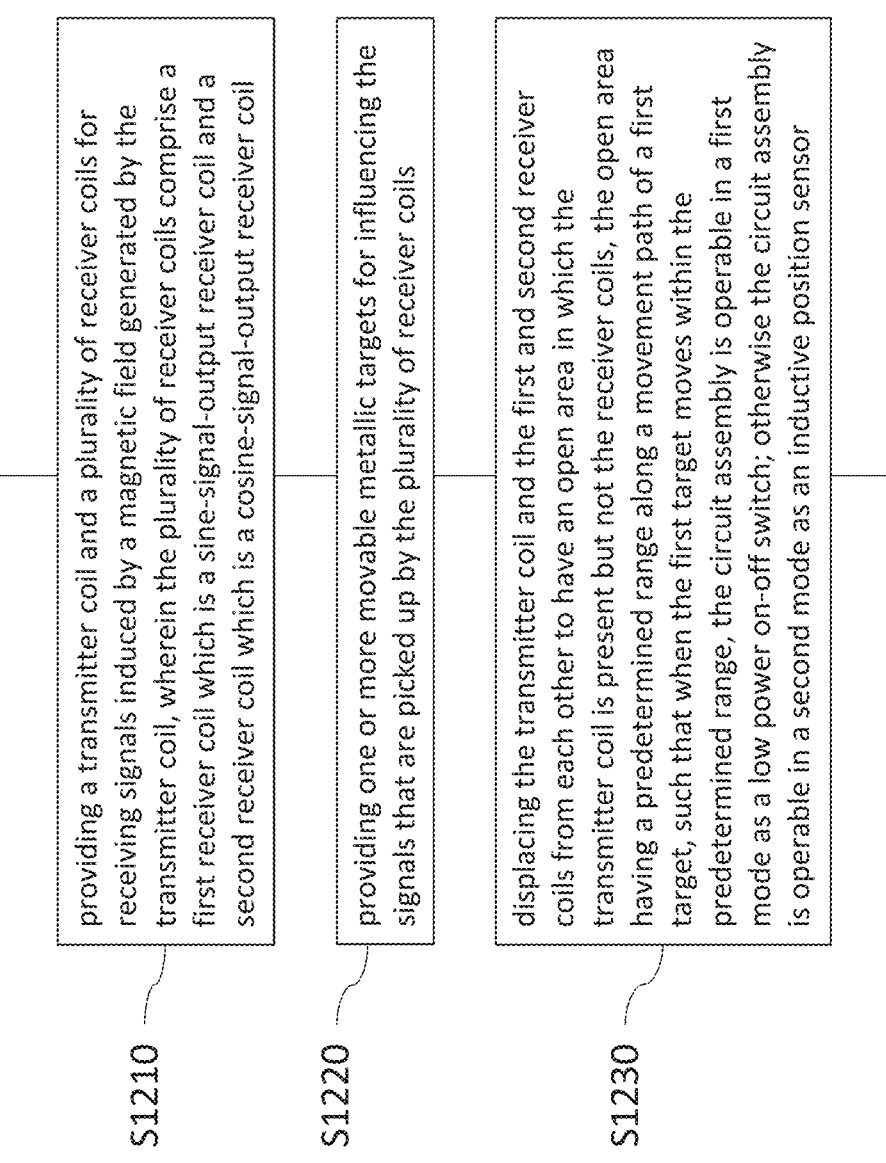

S1210 providing a transmitter coil and a plurality of receiver coils for receiving signals induced by a magnetic field generated by the transmitter coil, wherein the plurality of receiver coils comprise a first receiver coil which is a sine-signal-output receiver coil and a second receiver coil which is a cosine-signal-output receiver coil

S1220 providing one or more movable metallic targets for influencing the signals that are picked up by the plurality of receiver coils

S1230 displacing the transmitter coil and the first and second receiver coils from each other to have an open area in which the transmitter coil is present but not the receiver coils, the open area having a predetermined range along a movement path of a first target, such that when the first target moves within the predetermined range, the circuit assembly is operable in a first mode as a low power on-off switch; otherwise the circuit assembly is operable in a second mode as an inductive position sensor

CIRCUIT ASSEMBLY, METHOD THEREOF AND APPARATUS

TECHNICAL FIELD

The present disclosure is generally directed to techniques related to trigger switches, and more particularly to techniques related to contactless implementations of trigger switches.

BACKGROUND

Power tools are widely used in various industries, and designed to operate effectively under challenging conditions. However, these conditions usually include exposure to dust, moisture, extreme temperatures, mechanical shock, vibration, mechanical wear and tear, etc. While power tools may be constructed to be rugged and versatile, certain components (e.g., trigger switches used therein) may be more susceptible to failure, impacting the overall reliability and lifespan of the tools. A significant vulnerability has been identified in the trigger switches of power tools. In fact, in some research, the number one cause of field returns of power tools may be considered to be due to the failure of these trigger switches.

Existing trigger switches are often based on a contacting method/implementation (see for instance the illustrative (non-limiting) example of FIG. 1), which, while functional, may have several inherent disadvantages. For example, the contacting nature of these switches makes them prone to reliability issues, particularly in the presence of dust, vibration, and moisture, which may unfortunately be ubiquitous in the environments where power tools are typically utilized. Furthermore, these switches may often require complex assembly processes. However, the necessity for encapsulation and more particularly the use of lubricants to maintain operation not only increases manufacturing complexity and cost but also introduces additional points of potential failure. For example, over time, the protective encapsulation may degrade, and lubricants may dry out or become contaminated, leading to switch failure.

Moreover, as can also be understood and appreciated by the skilled person, apart from power tools, trigger switches may also be used wildly elsewhere, including, for example gaming devices, and controllers for (remote-controlled) drone/airplane/boat/car, or the like.

Therefore, there exists a need for an improved trigger switch design that can overcome the problems associated with conventional contact-based techniques, and more particularly, that has enhanced reliability, reduced complexity of assembly, and/or extended operational lifespan of the respective tools even under harsh environmental conditions.

SUMMARY

In view of some or all of the above technical problems, the present disclosure generally provides a circuit assembly, an apparatus, and a corresponding method, having the features of the respective independent claims.

According to an aspect of the disclosure, there is provided a circuit assembly (sometimes also referred to herein as a circuit design, setup, implementation, or the like). Such circuit assembly (e.g., integrated circuit/IC) may be used for implementing a trigger switch that could be widely used in various suitable apparatuses/devices, including (but certainly not limited thereto) power tools, gaming devices, (remote) controllers, etc.).

In particular, the circuit assembly may comprise a transmitter coil and a plurality of receiver coils for receiving signals induced by a (radio frequency/RF) magnetic field generated by the transmitter coil. The number of receiver coils may be determined depending on the number of functions (e.g., on/off switching, linear position sensor, or the like) to be utilized, as will be discussed in more detail below. As may be understood and appreciated by the skilled person, the transmitter and receiver coils may be suitably wound in any suitable form (e.g., anti-serially wound, or the like), depending on various implementations and/or requirements. The circuit assembly may also comprise one or more movable metallic (e.g., copper) targets for influencing the signals that are picked up by the plurality of receiver coils. In particular, the plurality of receiver coils may comprise a first receiver coil which is a sine-signal-output receiver coil (or sometimes also referred to simply as sine receiver coil) and a second receiver coil which is a cosine-signal-output receiver coil (or sometimes also referred to simply as cosine receiver coil); and more particularly, the transmitter coil and the first and second receiver coils may be displaced from each other to have an open area (sometimes may also be referred to as a "reserved" area) in which the transmitter coil is present but not the first and second receiver coils. Put differently, depending on various implementations, there may still exist some other receiver coil(s) (but not the first/sine and second/cosine ones) in this open area, which may generally be considered to be reserved for some other appropriate functionality, as will be described in detail below. Specifically, the open (reserved) area may have a predetermined range along a movement (travel) path of a first target, such that when the first target moves within the predetermined range, the circuit assembly may be operable in a first mode as a low power on-off switch; otherwise (e.g., when the first target moves beyond the predetermined range) the circuit assembly may be operable in a second mode as an inductive position sensor. Incidentally, although it is generally considered to be already well-known and understandable to the skilled person, it may nevertheless be worth mentioning that the "sine" receiver coil as used herein is typically wound in a suitable way that its response is maximized when the target is aligned with the sine axis of the sensor, and the output signal of the "sine" coil may be represented (in mathematical terms) as the sine of the angular displacement of the target (e.g., with respect to a reference axis). Similarly, the "cosine" receiver coil is suitably designed to produce a maximum response when the target is aligned with the cosine axis of the sensor; and the output signal thereof may be expressed as the cosine of the angular displacement of the target (e.g., with respect to a reference axis). Arranged as such, the combination of the sine and cosine (output) signals may generally allow for the calculation of the exact position or displacement of the target.

Configured as such, broadly speaking, the present disclosure generally seeks to replace incumbent contacting switches (and sometimes also the potentiometer), which may be prone to reliability issues from dust, vibration, moisture, etc. as discussed earlier, by a contactless, more reliable solution. More particularly, as proposed above, for the target movement in the predetermined range (e.g., the first 2-3 mm), it may operate as a switch in a low power mode; while in the remaining travel path, it may operate with normal power as a linear position sensor. Thereby, when being implemented in a suitable device (e.g., a power tool, a remote controller, or the like), it may be made possible that, in standby (the first mode), e.g. when the trigger is released, the device can be ensured to be securely turned off, consuming as little power as possible but remaining checking whether the trigger is moving, to turn the device back on again once it has been pushed beyond a switching threshold; whilst in normal operation (the second mode), the speed (e.g., of the motor of the power tool) may be regulated through a linear position sensor. As will become apparent below, further functionality may be made possible as well, for example by incorporating further suitable receiver coil(s).

In some example embodiments, the first receiver coil and the second receiver coil may be arranged next to each other, one on top of another, or interleaved with each other. Of course, according to various implementations and/or circumstances, the receiver coil may be arranged in any other suitable manner, as will be understood and appreciated by the skilled person. For instance, in some possible cases, the first receiver coil and the second receiver coil may be placed next to each other. In some other possible cases, to possibly save space, each coil may be placed on a different layer of the printed circuit board (PCB). In some further possible cases, it is also possible to place the coils interleaved with each other on the same layers of the PCB.

In some example embodiments, the predetermined range may be determined based on a first predetermined threshold.

In some example embodiments, when a magnitude of a signal of the second receiver coil is above the first threshold, the circuit assembly may be configured to operate in the second mode (as the inductive position sensor). The magnitude of the signal as used herein throughout the present disclosure may be calculated in any suitable form, depending on various implementations and/or circumstances. For instance, in some possible cases, the magnitude of the signal may be calculated as simply as an amplitude of the signal (or the absolute value thereof, in some examples), or as any other suitable form, as will be understood and appreciated by the skilled person.

In some example embodiments, the circuit assembly may be configured to (continuously) operate in the second mode as long as a magnitude of signals of the first (sine) and second (cosine) receiver coils is above a second predetermined threshold. Similarly, the magnitude of a plurality of signals (here in the present case, the output signals of the first and second receive coils) as used herein throughout the present disclosure may also be calculated in any suitable form. For instance, in some possible cases, the magnitude of the signals of the first and second receiver coils may be calculated as the square root of the sum of the squares of the respective (sine and cosine) signal amplitudes. Of course, any other suitable magnitude representation or calculation may be possible as well, as will be understood and appreciated by the skilled person.

In some example embodiments, when operating in the first mode, the circuit assembly may be configured to monitor only a signal picked up by the second (cosine) receiver coil. As such, power consumption may be further saved.

In some example embodiments, when operating in the second mode, the circuit assembly may be configured to monitor signals picked up by both the first (sine) and second (cosine) receiver coils for determining a position of the first target. By the combination of both the sine and cosine (output) signals, calculation of the exact position or displacement of the target may be achieved.

In some example embodiments, the circuit assembly may be configured to generate a first indicating signal and a second indicating signal, such that the first indicating signal may be set to an 'ON' status when a magnitude (e.g., an amplitude) of a signal of the second receiver coil is above a first threshold, otherwise the first indicating signal may be set to an 'OFF' status. On the other hand, the second indicating signal may be set to an 'ON' status when a magnitude (e.g., a square root of a sum of squares of respective amplitudes) of signals of the first and second receiver coils is above a second predetermined threshold, otherwise, the second indicating signal may be set to an 'OFF' status. The 'ON'/'OFF' status may be implemented for example as a high/low signal, '1'/'0' signal, or any other suitable form, as will be understood and appreciated by the skilled person.

In some example embodiments, the circuit assembly may be configured to operate in the first mode when both the first and second indicating signals are in the 'OFF' status, otherwise (e.g., any of the first and second indicating signals is/are in the 'ON' status) the circuit assembly may be configured to operate in the second mode.

In some example embodiments, the circuit assembly may further comprise a second (movable metallic) target and an additional (e.g., referred to as a third) receiver coil which itself may comprise (or consist of) two coils (or sometimes also referred to as coil ends) that are arranged next to each other in a movement/travel direction of the second target within the open (reserved) area. These two coils (or coil ends) may for example be wound anti-serially or in any other suitable manner. Thereby a switching position detection functionality may be implemented. For instance, depending on various implementations, it may be possible to detect or determine whether the second target is (relatively) over one or another coil (or coil end) of the third receiver coil. In some possible cases, such switching position detection functionality may in turn further allow for possibly implementing (e.g., mimicking) the selection (or switching) of the rotational direction (e.g., left/counter-clockwise, neutral, right/clockwise) of the motor of the power tool or the like, for example. It may be worth mentioning that, in some examples, it may also be possible to implement two (separate) receiver coils instead of only one receiver coil (which itself comprises two coil ends) as illustrated above.

In some example embodiments, the switching position may be detected (or determined) based on for example a phase and/or a strength (e.g., an amplitude or the like) of a signal picked up by the two (anti-serially wound) coils due to movement/travel of the second target relative to the two (anti-serially wound) coils.

In some example embodiments, the switching position detection functionality may be a three-way switch position detection functionality for detecting a first position where the second target is farther away from one coil of the two anti-serially wound coils, a second position where the second target is farther away from the other coil of the two anti-serially wound coils and a third position where the second target is substantially equidistant from the two anti-serially wound coils (for instance, the second target may cover both coils partly with the same amount of area, potentially resulting in (substantially) the same signal strength but opposite polarity) or covers neither of the two anti-serially wound coils. More particularly, the first position may be detected (or determined) for example by detecting a receiver signal being in phase with a transmitter signal and a level of the receiver signal being above a predefined threshold. Similarly, the second position may be detected by detecting a receiver signal being 180° out of phase (inverted) with a transmitter signal and a level of the receiver signal being above a predefined threshold. Finally, the third position may be detected by detecting a level of the receiver signal being below a predefined threshold.

In some example embodiments, the circuit assembly may be configured for implementing a contactless trigger switch. As indicated above, such a contactless trigger switch may be widely usable in for example a power tool, a gaming device, a (remote) controller of a drone, an airplane, a boat or a car, or any other suitable apparatus/device. The application area of such a contactless trigger switch is not to be limited in the present disclosure.

Correspondingly, according to another aspect of the present disclosure, there is also provided an apparatus that comprises the circuit assembly according to the preceding aspect.

Further, according to yet another aspect of the present disclosure, there is provided a method of a circuit assembly.

In particular, the method may comprise providing a transmitter coil and a plurality of receiver coils for receiving signals induced by a magnetic field generated by the transmitter coil. The method may also comprise providing one or more movable metallic targets for influencing the signals that are picked up by the plurality of receiver coils. In particular, the plurality of receiver coils may comprise a first receiver coil which is a sine-signal-output receiver coil and a second receiver coil which is a cosine-signal-output receiver coil. Finally, the method may comprise displacing the transmitter coil and the first and second receiver coils from each other to have an open area in which the transmitter coil is present but not the first and second receiver coils. In particular, the open area may have a predetermined range along a movement path of a first target, such that when the first target moves within the predetermined range, the circuit assembly is operable in a first mode as a low power on-off switch; otherwise, the circuit assembly is operable in a second mode as an inductive position sensor.

Configured as such, broadly speaking, the present disclosure generally seeks to replace incumbent contacting switches (and sometimes also the potentiometer), which may be prone to reliability issues from dust, vibration, moisture, etc. as discussed earlier, by a contactless, more reliable solution. More particularly, as proposed above, for the target movement in the predetermined range (e.g., the first 2-3 mm or the like), it may operate as a switch in a low power mode; while in the remaining travel path, it may operate with normal power as a linear position sensor. Thereby, when being implemented in a suitable device (e.g., a power tool, a remote controller, or the like), it may be made possible that, in standby (the first mode), e.g. when the trigger is released, the device can be ensured to be securely turned off, consuming as little power as possible but remaining checking whether the trigger is moving, to turn the device back on again once it has been pushed beyond a switching threshold; whilst in normal operation (the second mode), the speed (e.g., of the motor of the power tool) may be regulated through a linear position sensor. Of course, in some possible cases, further functionality may be made possible as well, for example by incorporating further suitable receiver coil(s).

Details of the disclosed method may be implemented as systems (e.g., in the form of circuitry) adapted to execute some or all of the steps of the method, and vice versa, as the skilled person will appreciate. In particular, it is understood that methods according to the disclosure relate to methods of operating the systems (or circuitry) according to the above embodiments and variations thereof and that respective statements made with regard to the systems (or circuitry) likewise apply to the corresponding methods, and vice versa.

It is also understood that in the present disclosure, the term "couple" or "coupled" refers to elements being in electrical communication with each other, whether directly connected e.g., via wires or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a possible contacting implementation of a trigger switch, FIG. 2 schematically illustrates an example of a possible implementation based on inductive position sensing technology, FIG. 3 schematically illustrates another example of a possible implementation of an arrangement of the coils and target for use in an inductive position sensor assembly, FIG. 4 schematically illustrates a working principle of the arrangement of FIG. 3, FIGS. 5-8 schematically illustrate examples of a possible implementation of a circuit assembly according to embodiments of the present disclosure, FIG. 9 schematically illustrates an example of a possible implementation of a two-way switch circuit assembly according to embodiments of the present disclosure, FIG. 10 schematically illustrates an example of a possible implementation of a three-way switch circuit assembly according to embodiments of the present disclosure, FIG. 11 schematically illustrates another example of a possible implementation of a circuit assembly according to embodiments of the present disclosure, and FIG. 12 is a flowchart schematically illustrating an example of a method of a circuit assembly according to embodiments of the present disclosure.

DETAILED DESCRIPTION

As indicated above, identical or like reference numbers in the present disclosure may, unless indicated otherwise, indicate identical or like elements, such that repeated descriptions thereof may be omitted for reasons of conciseness.

Broadly speaking, techniques related to trigger switch assembly are widely used in various fields/areas, e.g., power tools, gaming devices, and controllers for (remote-controlled) drone/airplane/boat/car, or the like. However, particularly taking power tools as an example, they are generally designed to operate effectively under various challenging conditions, which however usually involve exposure to dust, moisture, extreme temperatures, mechanical shock, vibration, mechanical wear and tear, etc. While power tools may be constructed to be rugged and versatile, some components such as trigger switches may be more susceptible to failure, impacting the overall reliability and lifespan of the tools. According to some research, the number one cause of field returns of power tools may be considered to be due to the failure of these trigger switches.

Figure 1:
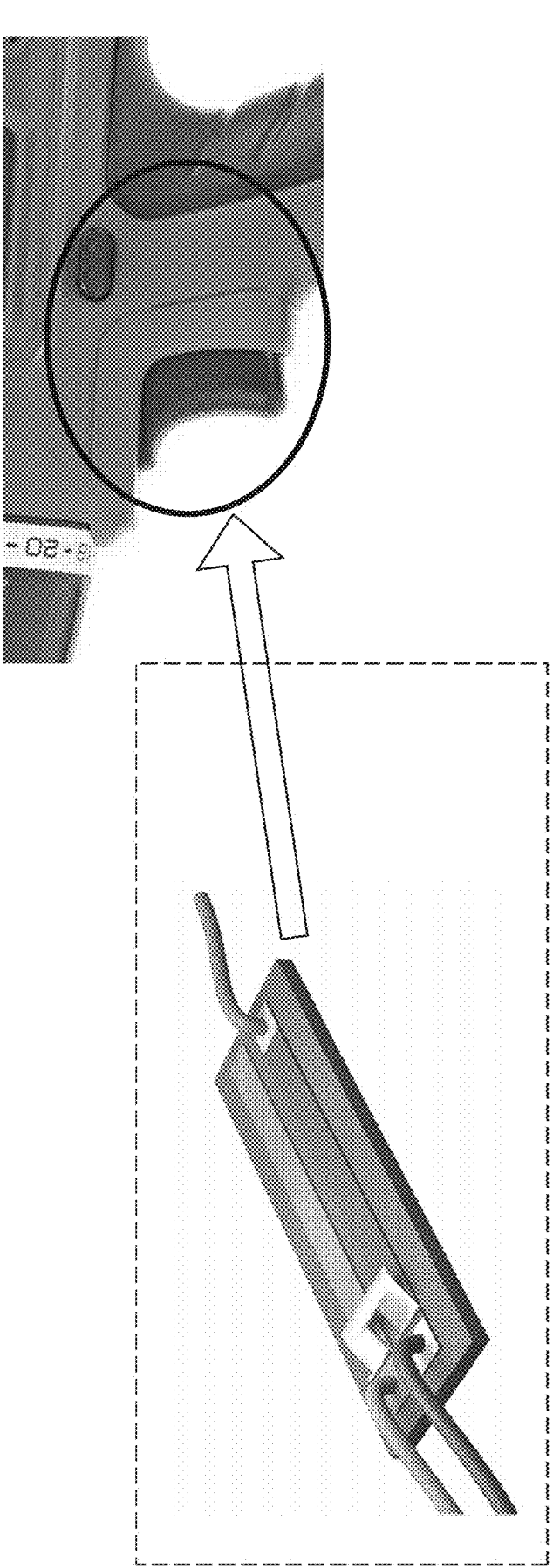

One of the reasons may be considered to lie in the fact that existing trigger switches are often based on a contacting method/implementation (see for instance the illustrative (non-limiting) example of FIG. 1), which, while functional, may have several inherent disadvantages. For example, the contacting nature of these switches makes them prone to reliability issues, particularly in the presence of dust, vibration, and moisture, which may unfortunately be ubiquitous in the environments where those tools are typically utilized. Furthermore, these switches may often require complex assembly processes. However, the necessity for encapsulation and more particularly the use of lubricants to maintain operation not only increases manufacturing complexity and cost but also introduces additional points of potential failure. For example, over time, the protective encapsulation may degrade, and lubricants may dry out or become contaminated, leading to switch failure.

In view thereof, in a broad sense, the present disclosure generally proposes techniques and/or mechanisms for improvement in the design and/or implementation of a circuit assembly for implementing a trigger switch which may in turn useable in apparatuses/devices like power tools, gaming devices, as controller for (remote controlled) drone/airplane/boat/car, or the like, as indicated above. More particularly, techniques and/or mechanisms as proposed in the present disclosure may enhance reliability, reduce complexity of assembly, extend operational lifespan of the respective tools even under harsh environmental conditions, etc.

In order to be able to implement a trigger switch, at least some basic functions thereof may be considered. For instance, it may be first of all desirable to implement an on/off switch functionality for switching between standby and active/normal modes (operations). Secondly, there may also be implemented a speed (e.g., of the motor of the underlining tool) control functionality. In some possible cases, this may be achieved, for example by implementing a linear position sensor. In some examples, these two functionalities may be configured to be enabled/actuated by using a single component as in conventional trigger switch implementation (e.g., in the form of a slider or the like). Thirdly, in some possible cases, there may also be implemented a direction/rotation controlling functionality for example as a directional rotation switch for the motor (e.g., clockwise, neutral, or counterclockwise). This may be implemented as a separate/different component or embedded with the same component for implementing the other functionalities, depending on various implementations and/or circumstances. In some further cases, there may also be a need to implement functionalities like analog and/or digital interface to an external microcontroller, or the like, as can be understood and appreciated by the skilled person. In short, the idea/goal of the techniques/mechanisms proposed by the present disclosure is that the form factor (e.g., in terms of size, space, weight, price, etc.) of the contactless implementation is similar or comparable to that of the incumbent contacting trigger switches that are in use today.

Generally speaking, the above is made possible on the basis of inductive position sensing technology. Particularly in a nutshell, as will be discussed in greater detail below, the present disclosure generally proposes to re-use an existing coil to function as an on-off switch, to wake up the device from a low power mode.

Figure 2:
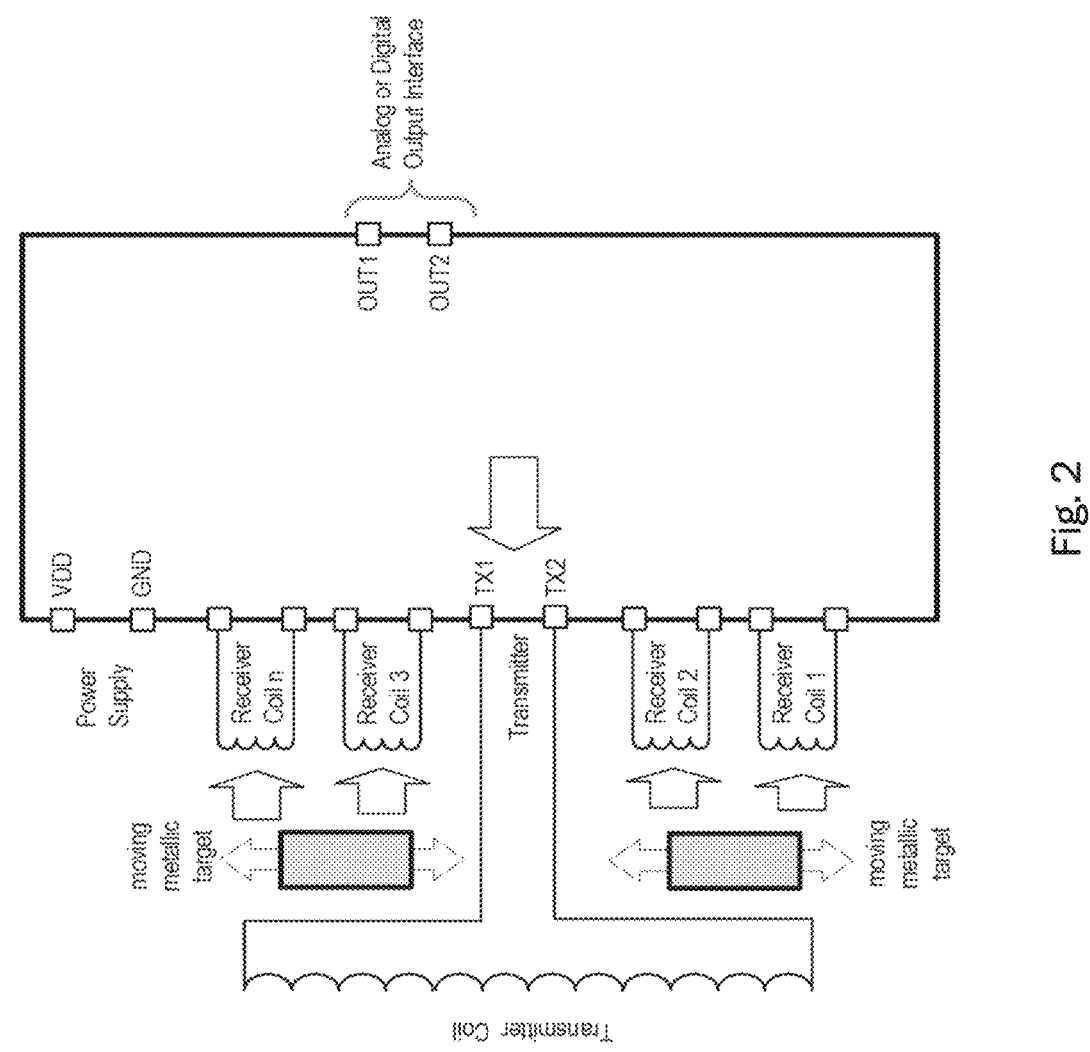

With reference to the illustrative example as shown in FIG. 2, an exemplary inductive position sensor IC (integrated circuit) may be understood to typically comprise a transmitter coil and several receiver coils, depending on the number of functions to be utilized.

The transmitter coil may generate an RF (radio frequency) magnetic field that may be picked up by the receiver coils. In addition, one or more moving metallic targets may be provided to influence the signals picked up by the receiver coils, which are then suitably converted into position information inside the position sensor IC.

Figure 3:
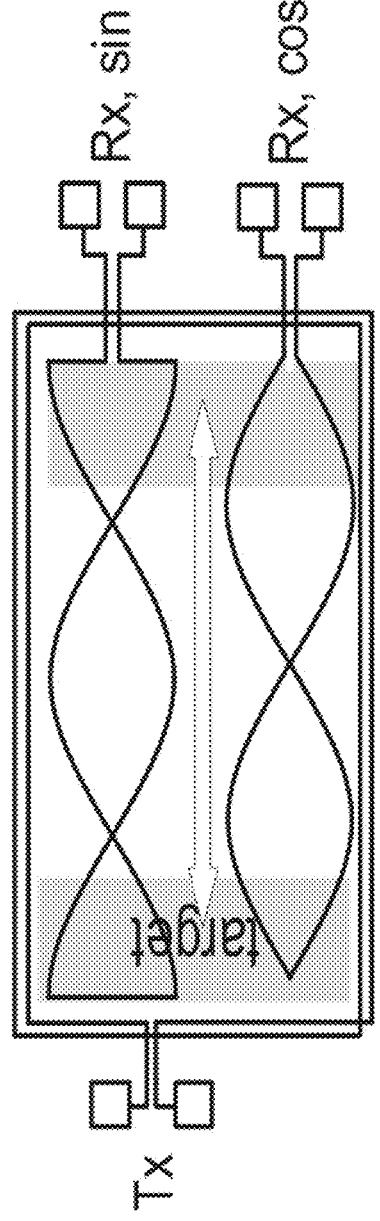

FIG. 3 further schematically illustrates a simplified implementation (of an arrangement of the coils and target) based on the inductive sensing principle, which will be used as the basis for illustrating the possible implementations of the circuit assembly according to embodiments of the present disclosure below. However, it may be worth mentioning that such simplified implementation is merely provided for illustrative purposes and thus should in no way be understood to constitute a limitation of any kind.

Therein, one transmitter (Tx) coil and two (or more, in some possible cases) receiver coils, in combination with a moving metallic target, may be used to determine the position of that metallic target by evaluating the receiver signals (hereinafter denoted as "Rx, sin" and "Rx, cos" respectively for easy referencing), for example through demodulation (synchronous rectification) and low pass filtering or the like. In this sense, the respective receiver coils may be referred to as a sine-signal-output receiver coil (or simply as a sine receiver coil) and a cosine-signal-output receiver coil (or simply as a cosine receiver coil). As can be understood and appreciated by the skilled person, the "sine" receiver coil as used herein may typically be wound in a suitable way that its response is maximized when the target is aligned with the sine axis of the sensor, and the output signal of the "sine" coil may be represented (in mathematical terms) as the sine of the angular displacement of the target (e.g., with respect to a reference axis). Similarly, the "cosine" receiver coil may be suitably designed to produce a maximum response when the target is aligned with the cosine axis of the sensor; and the output signal thereof may be expressed as the cosine of the angular displacement of the target (e.g., with respect to a reference axis).

Figure 4:
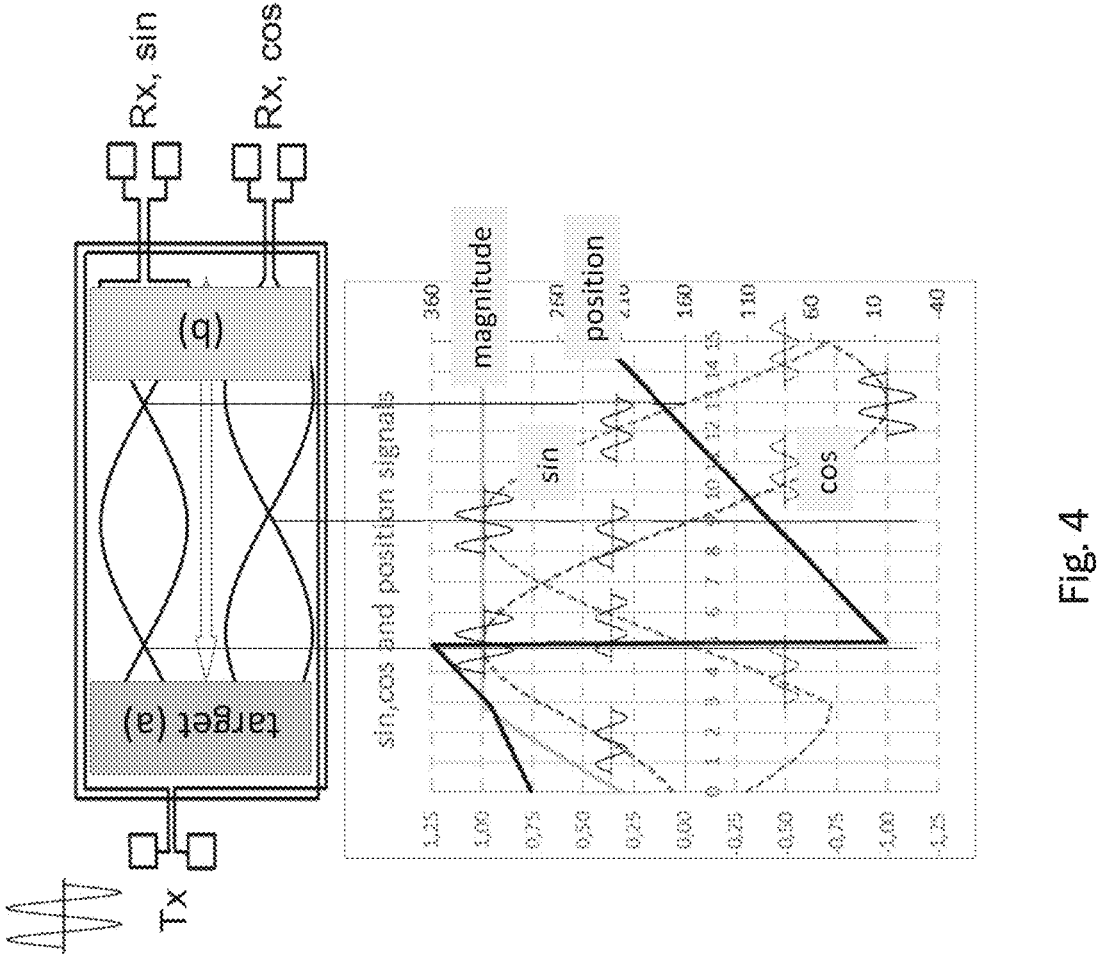

To be more specific, as is also illustratively shown for example in FIG. 4, as the target moves from position (a) to position (b), sine signal (sin) and cosine signal (cos) are generated with varying amplitude and phase, where the phase is either in phase with the Tx signal (e.g., indicated as positive Rx signal) or 180° out of phase with the Tx signal (e.g., indicated as negative Rx signal). These signals are illustratively shown in FIG. 4 as 1-periodic sinewaves.

By suitable demodulation (e.g., synchronous rectification or the like) and low pass filtering, steady state signals may be generated that are 90° out of phase with each other. These signals are illustratively shown in FIG. 4 as dashed "sin" and "cos" signals.

Then, by application of a suitable coordinate transformation algorithm (e.g., a CORDIC (coordinate rotation digital computer) algorithm, such as arctan 2(cos/sin) or the like, details of which are not described herein for the sake of conciseness), the sin and cos signals can be converted to a unique position signal within the range of travel of the target. This signal, indicating the target's unambiguous position along the travel path within the target positions (a) to (b) is illustratively shown in FIG. 4 as the solid line (denoted by "Position").

Further, a signal magnitude (or any other suitable representation indicative of the signal strength) may be calculated for example as magnitude=sqrt ($\sin^2 + \cos^2$). In some possible examples, this signal may be further used to determine whether the signal is valid (e.g., the target is within the movement area (a)↔(b)) or not (e.g., the target is outside the movement area (a)↔(b)). As noted above, broadly speaking, the aim of the proposed contactless trigger switch techniques is to possibly replace the incumbent contacting switches (and in some possible cases, also a potentiometer) that have been conventionally used, which are known to be prone to reliability issues from such as dust, vibration, moisture, etc., by a contactless, more reliable solution.

Accordingly, in some possible cases, this proposed device may be implemented to fulfill at least one or more of the below key functions, namely:

1. in standby, for example when the trigger is released, to be able to ensure that the tool is securely turned off, thereby consuming as little power as possible, but also to remain (continuously) checking whether the trigger is moving, so as to be able to turn the device back on again once it has been pushed beyond a (predetermined or predefined) switching threshold;

2. in normal operation, to possibly regulate or control the speed of the tool motor through a linear position sensor; or 3. optionally, to be able to select a rotational direction (e.g., left/counter-clockwise, neutral, right/clockwise, or the like) of the motor for example through a separate multi-way switch (e.g., a two-way switch, a three-way switch, or the like).

Figure 5:
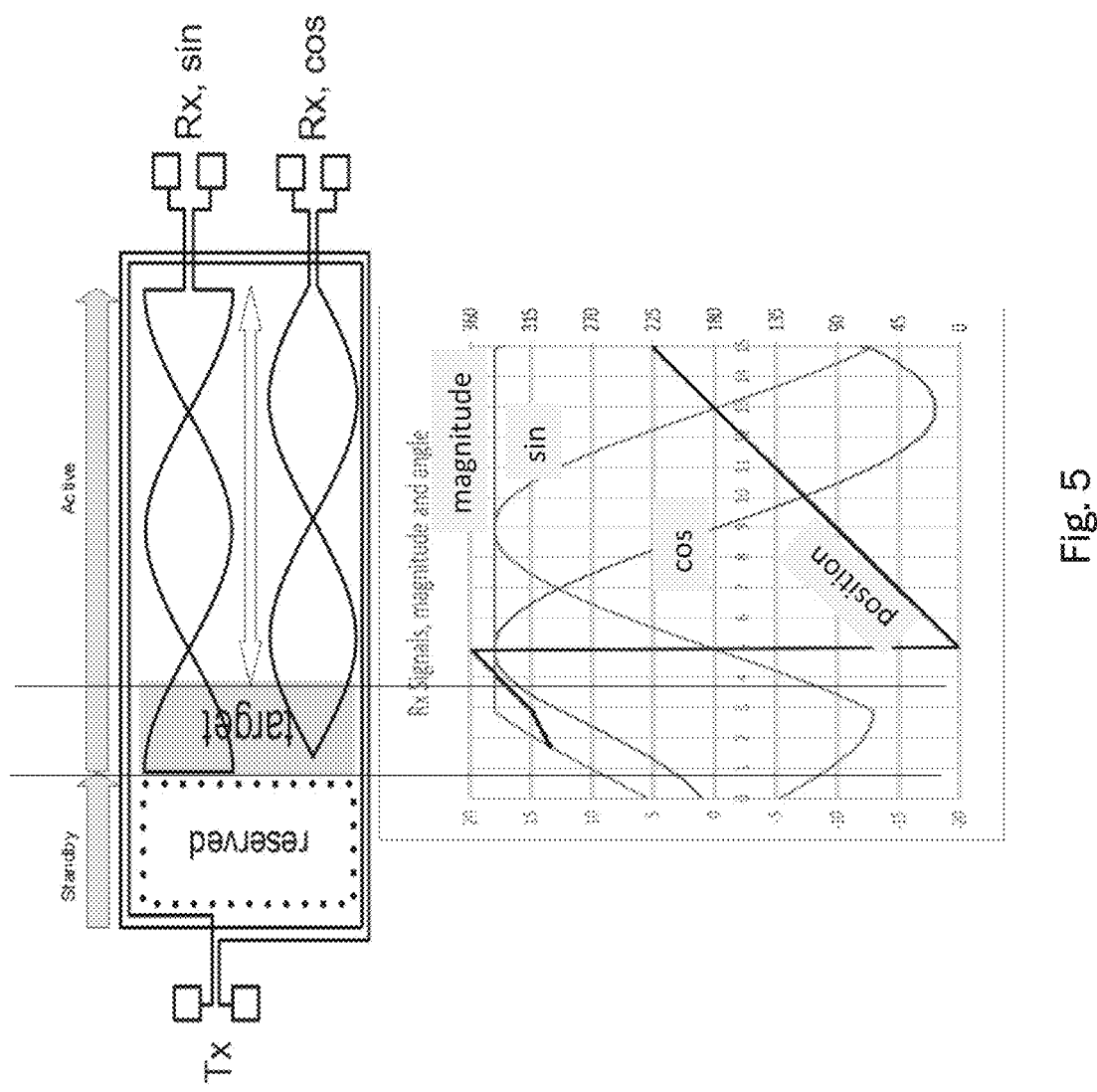

In order to achieve the above, in some possible example embodiments of the present disclosure, for a predetermined length/range of target movement (e.g., the first 2-3 mm or the like, see for instance the illustrative example of FIG. 5), it may be configured to operate for example as a (on-off) switch in a low power mode (sometimes may also referred to as a standby mode); while in the remaining travel path, it may instead be configured to operate with normal power for example as a linear position sensor (sometimes may also referred to as an active mode). As will be discussed in more detail below, in some possible examples, this predetermined range may be determined based on a predetermined/pre-defined threshold.

In addition, in some possible examples, a separate multi-way switch (e.g., a three-way switch) may be configured to operate as a rotational direction switch of the tool motor.

The linear position sensor may be based on a conventional or regular coil design described in the prior art. In the illustrative example shown in FIG. 5, it may be designed to be active from ~3-15 mm of travel or the like. More particularly, as can be seen from the example of FIG. 5, the left side of the coil has an open (reserved) area in which only the transmitter coil is present but not the first and second receiver coils. This open area is specifically reserved, for example for implementing some additional functionality if necessary, such as the rotational direction switch which will be described in more detail below. In this sense, it may be understood that there may still exist some other receiver coil(s) (but not the first/sine and second/cosine ones) in this open/reserved area, depending on various implementations.

Notably, in the illustrative example of FIG. 5, the two receiver coils (denoted as "Rx, sin" and "Rx, cos" in the figure) may appear as placed next to each other. However, this arrangement is not to be limited in the present disclosure, and any other suitable arrangement may be adopted as well, depending on various implementations and/or requirements. For instance, in some possible cases, to save space, these coils could be placed one on top of the other, for example each coil on a different layer of the printed circuit board (PCB). In some possible cases, it may also be possible to place the coils interleaved with each other on the same layers of the PCB.

Figure 6:
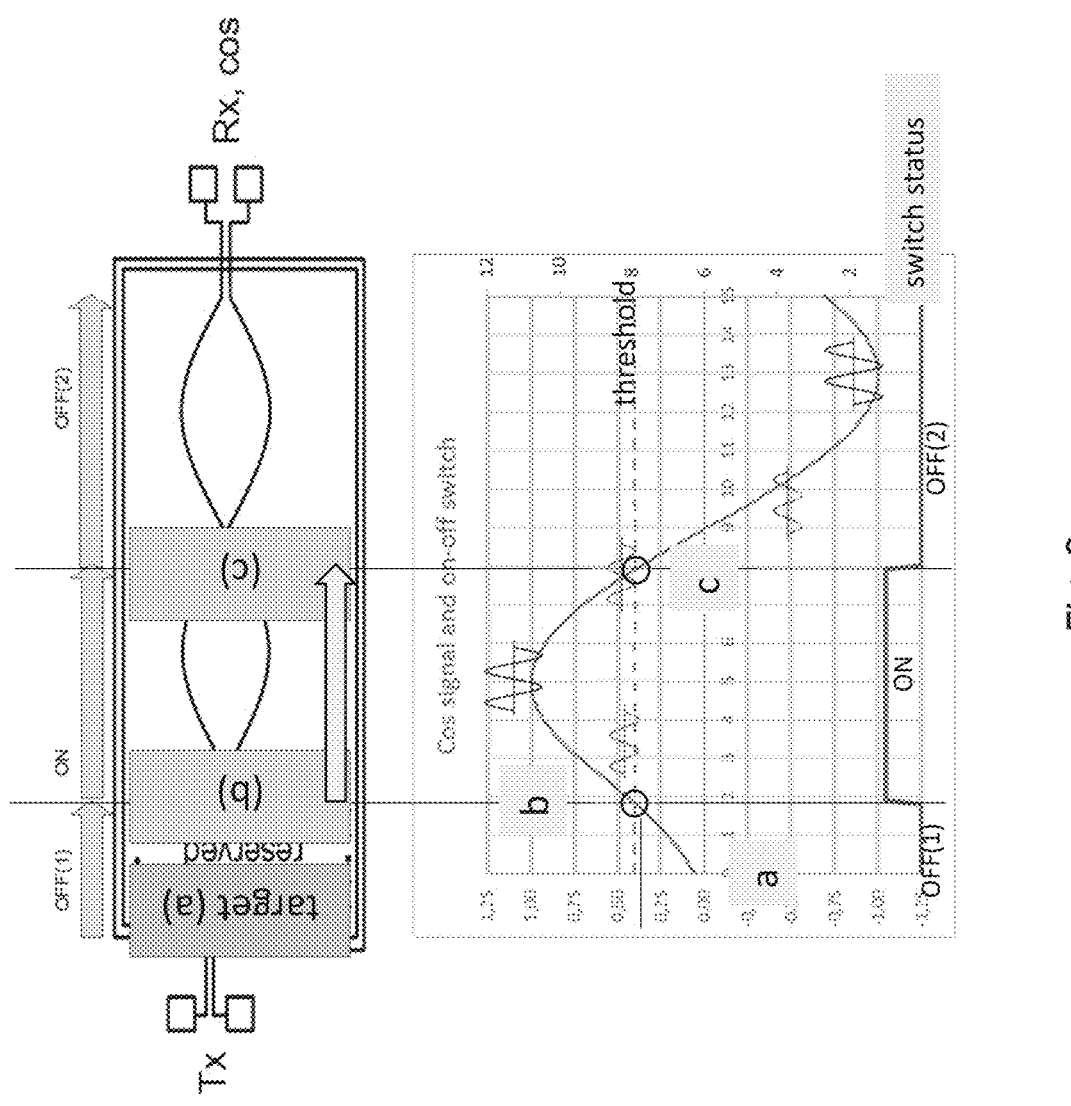

In some possible example embodiments of the present disclosure, as schematically illustrated in FIG. 6, the signal coming from the Rx, cos coil, that is used for the linear position sensor may also be (re-)used to act as an initial low power on-off switch as follows.

To be more specific, in the released position of the trigger lever, the target is in position (a). The corresponding Rx, cos signal amplitude would be below a first (predetermined or predefined) threshold and a corresponding switch status signal (the claimed first indicating signal) would be set to "OFF". Notably, in order to differentiate from a second "OFF" ("OFF (2)") status later, this switch status is herein referred to as "OFF (1)". Generally speaking, in this state, the circuit would be configured to run in a low (average) power mode. As can be understood and appreciated by the skilled person, low average power may be achieved by any suitable means, such as by reduction of the sampling rate and/or pulsed operation, or the like. Accordingly, in some possible cases, this mode may also be referred to simply as a pulsed low power mode.

If the target is then pushed away from the released position, for example moving from (a) towards (b), the corresponding Rx signal amplitude would increase, as illustratively shown in FIG. 6. Once the Rx signal amplitude (or any other suitable representation indicative of the amplitude) exceeds the level of the threshold, the corresponding switch status would be changed to "ON". In this state, the circuit would be configured to suspend the low power mode and instead run in a normal power mode. Accordingly, the linear position sensor is now activated. Thereby, it will monitor both the sin and cos signals to calculate the target position as well as the signal magnitude (or any other suitable representation indicative of the magnitude).

Figure 7:
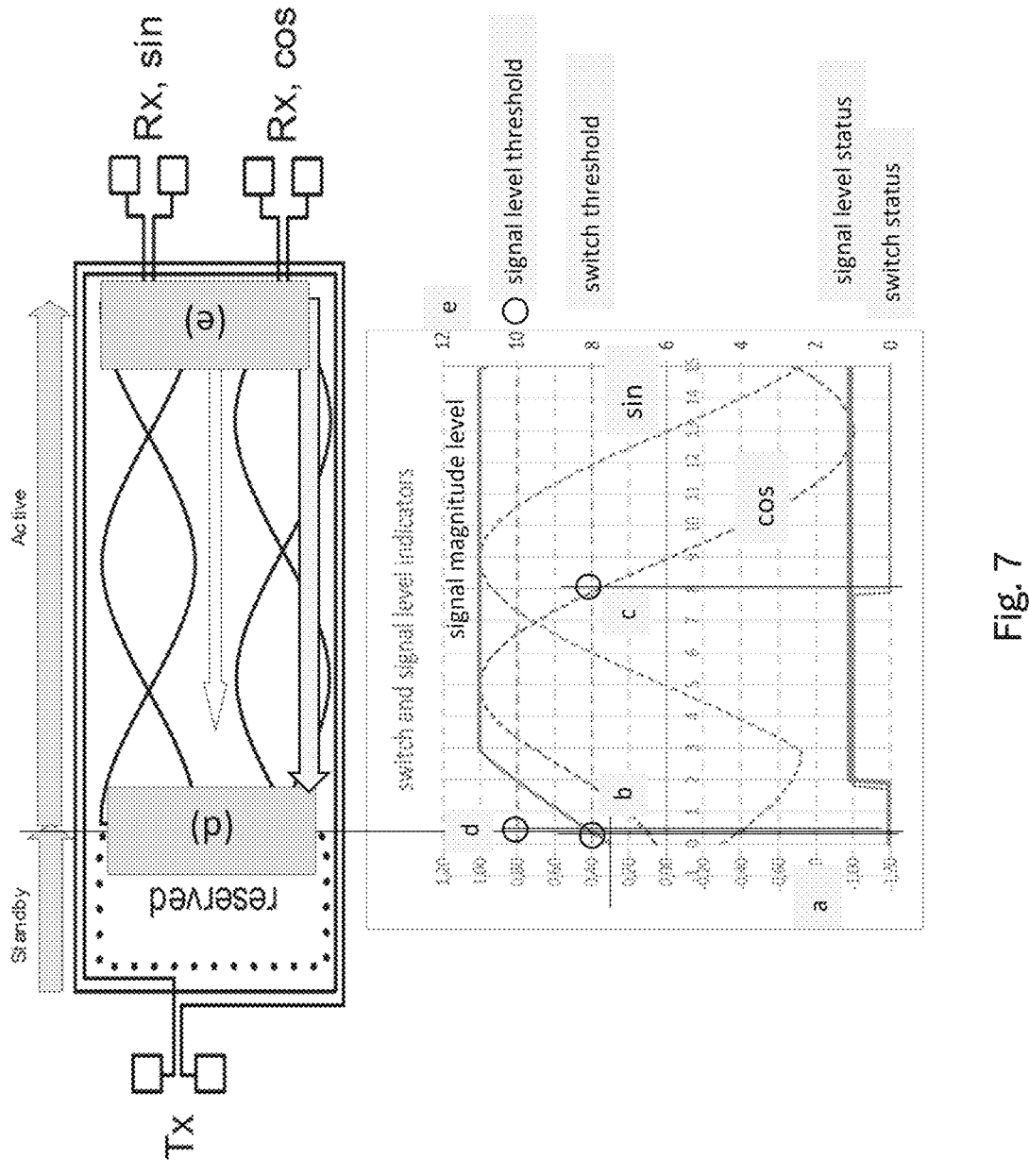

Once the target is further pushed beyond point (c), the corresponding Rx signal amplitude would again fall below the threshold, causing the switch status to be turned off again ("OFF(2)"). However, in comparison with the earlier OFF (1) status, at this position, the sensor circuit would remain turned on, as there would be a second indicating signal (denoted as "signal level status" in FIG. 7) to be observed in order to determine different on-off conditions.

To be more specific, as described earlier, once the device has turned on, the cos signal would exceed a defined signal level (a predetermined/predefined "switch threshold") at position (b), resulting in the switch status="ON". Moreover, it will remain turned on as long as the magnitude level (e.g., denoted as "signal magnitude level" in FIG. 7, which may be represented or calculated according to for example sqrt (sin^2+cos^2) or the like) remains above a second defined threshold (denoted as "signal level threshold" in FIG. 7) at position (d), and the signal level status remains "ON". Accordingly, this range is defined by a target position between (d) and (e), where the signal level status="ON".

On the other hand, when releasing the trigger, moving from position (e) towards position (a), the signal magnitude level would fall below the defined threshold ("signal level threshold") at position (d) and create a signal level status="OFF" signal, causing the device to switch off and return to (pulsed) low power mode, as previously described.

Figure 8:
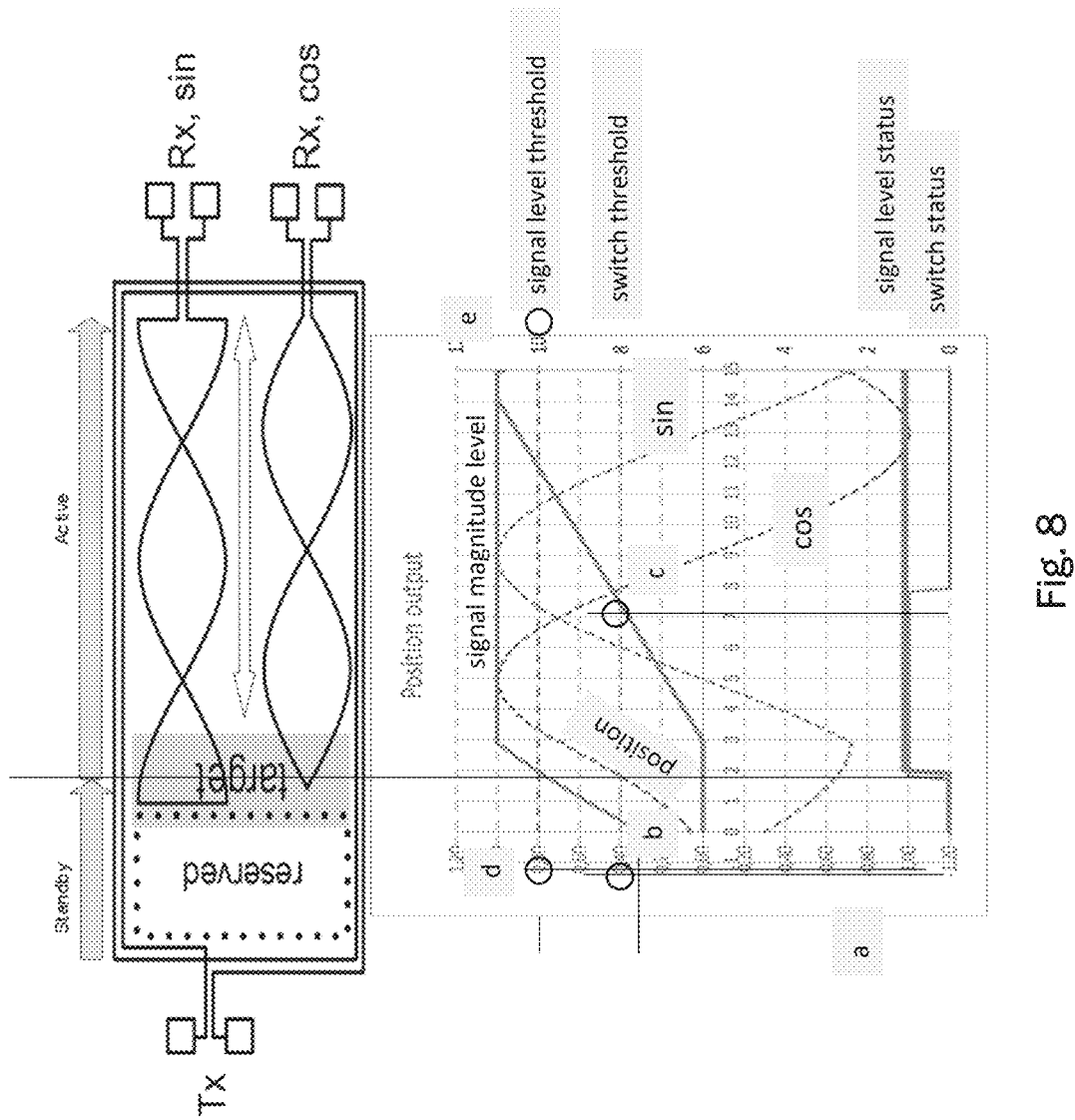

The above-illustrated processes/behaviors may be summarized in the following table with reference to the illustration shown in FIG. 8.

TABLE 1

| Summary of behaviors of the proposed circuit assembly | | |
| --- | --- | --- |
| target in position | indicator status | operating mode |
| between (a) and (b) | switch status = OFF | standby mode, low power operation, only cos coil is actively monitored |
| rising from (a) in low power, between (b) and (c) | switch status = ON | active/normal mode, all sensors are active, all coils are monitored; signal level and position are calculated, from sin and cos |
| >(d) | signal level status = ON | coil signals |
| >(c) | active/normal mode switch status = OFF | as long as signal level status is ON, switch status is ignored |
| falling below (d) and (b) in active mode | signal level status = OFF switch status = OFF | when both signal level status and switch status are OFF: standby mode, only cos coil is actively monitored |

It may be worth mentioning that although "ON" and "OFF" status/signal has been used above for illustrating the different states/statuses, this is just one possible example but should not be understood to constitute a limitation of any kind. As can be understood and appreciated by the skilled person, any other suitable representation may be used as well, such as "high"/"low", "1"/"0", or the like, depending on various implementations and/or circumstances.

In some further example embodiments of the present disclosure, there may be further proposed a multi-way (e.g., two-way or three-way, etc.) switch. Depending on various implementations and/or requirements, this multi-way switch may also, but does not necessarily have to, be operated in low (average) power, for example achieved by reduction of sampling rate and/or pulsed operation as illustrated above. In some possible implementations, this multi-way switch may be monitored when changing from low power (standby) mode to active mode, for example just before the motor is turned on.

Figure 9:
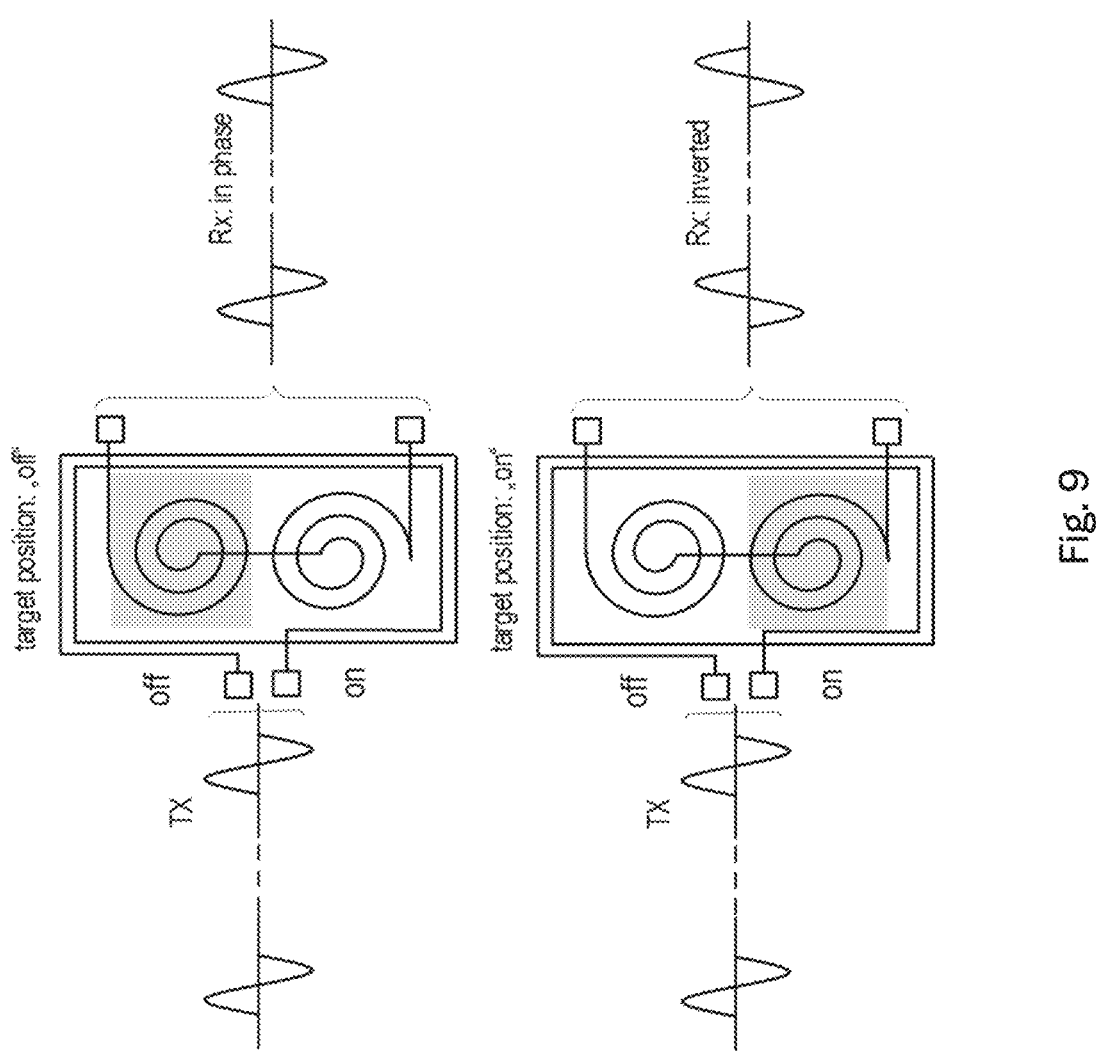

A possible example of an implementation of a two-way switch is illustratively shown in FIG. 9. Therein, broadly speaking, the receiver signal is checked for amplitude and phase in order to determine the switch position. For instance, in some possible implementations, the receiver signal being in phase with the transmitter signal may be used to indicate that the target is (substantially) over (covering) the upper coil, which may in turn be used to further indicate an "off" status (which, in this context, might mean for example clockwise motor movement or the like, but does not necessarily have anything to do with the "turned-off" status of the motor itself, as can be understood and appreciated by the skilled person). Similarly, the receiver signal being inverted with respect to the transmitter signal may be used to indicate that the target is (substantially) over (covering) the lower coil, which may in turn be used to further indicate an "on" status (which, in this context, might similarly mean for example counter-clockwise motor movement or the like, but does not necessarily have anything to do with the "turn-on" status of the motor itself, as can be understood and appreciated by the skilled person).

Figure 10:
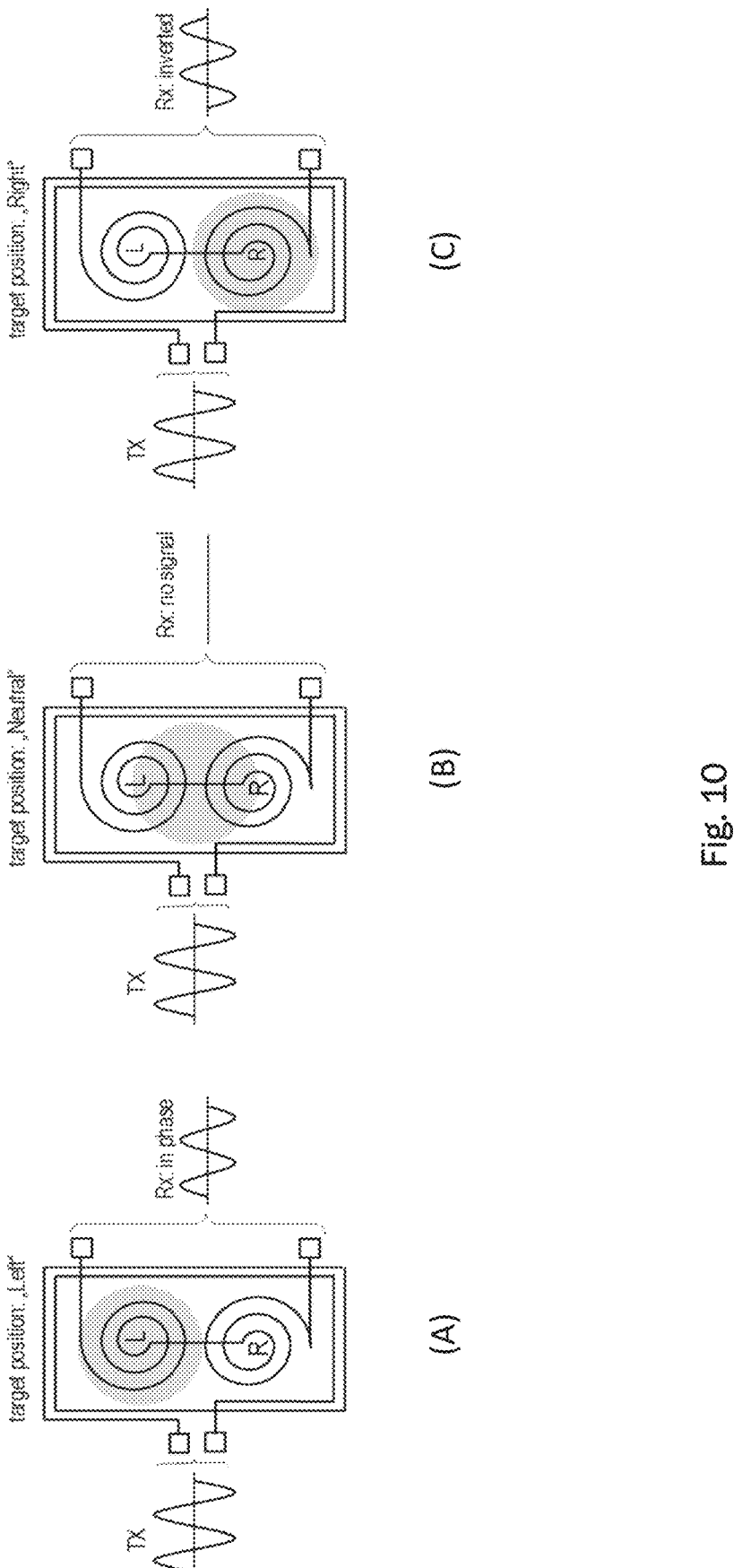

A further example of an implementation of a three-way switch is illustratively shown in FIG. 10. Therein, in some possible implementations, the actual receiver coil itself may comprise two coils (or sometimes also referred to as coil ends) that may be wound anti-serially (or in other suitable form), which are illustratively denoted as "L" (for left) and "R" (for right) in FIG. 10. In other words, generally speaking, in the example implementation shown in FIG. 10, there is a single, two-terminal (receiver) coil consisting of two anti-serially wound coil ends. Of course, as can be understood and appreciated by the skilled person, in some examples, it may also be possible to use two (separate) receiver coils instead of one receiver coil (which itself comprises two coil ends).

During operation, if no metallic target is placed on top of the coils (e.g., the target is for some reason missing), or if a target is placed (substantially) between the coils (or in other words, the target is substantially equidistant from the two anti-serially wound coils, or the target covers both coils partly with the same amount of area, thereby potentially resulting in (substantially) the same signal strength but opposite polarity), the voltages induced by coils "L" and "R" may cancel each other, as illustratively shown in diagram (B) of FIG. 10. On the other hand, if the target is placed (substantially) over "R" (or in other words, farther away from coil "L", as shown in diagram (C) of FIG. 10) or "L" (or in other words, farther away from coil "R", as shown in diagram (A) of FIG. 10), a corresponding receiver voltage would be generated which is either in phase (thus indicating "R") or out of phase (thus indicating "L") with the trans-mitter signal Tx.

Accordingly, the switching position may be detected or determined for example by checking the phase and/or signal strength of the Rx signal as follows:

Rx signal is in phase with Tx signal and the signal level (e.g., magnitude or the like) is above a predefined or predetermined threshold, thereby indicating that the target is over coil "L";

Rx signal is 180° out of phase with Tx signal and the signal level is above a predefined or predetermined threshold, thereby indicating that the target is over coil "R"; or Rx signal is below a predefined or predetermined thresh-old, thereby indicating that the target is missing or between coils "L" and "R".

Figure 11:
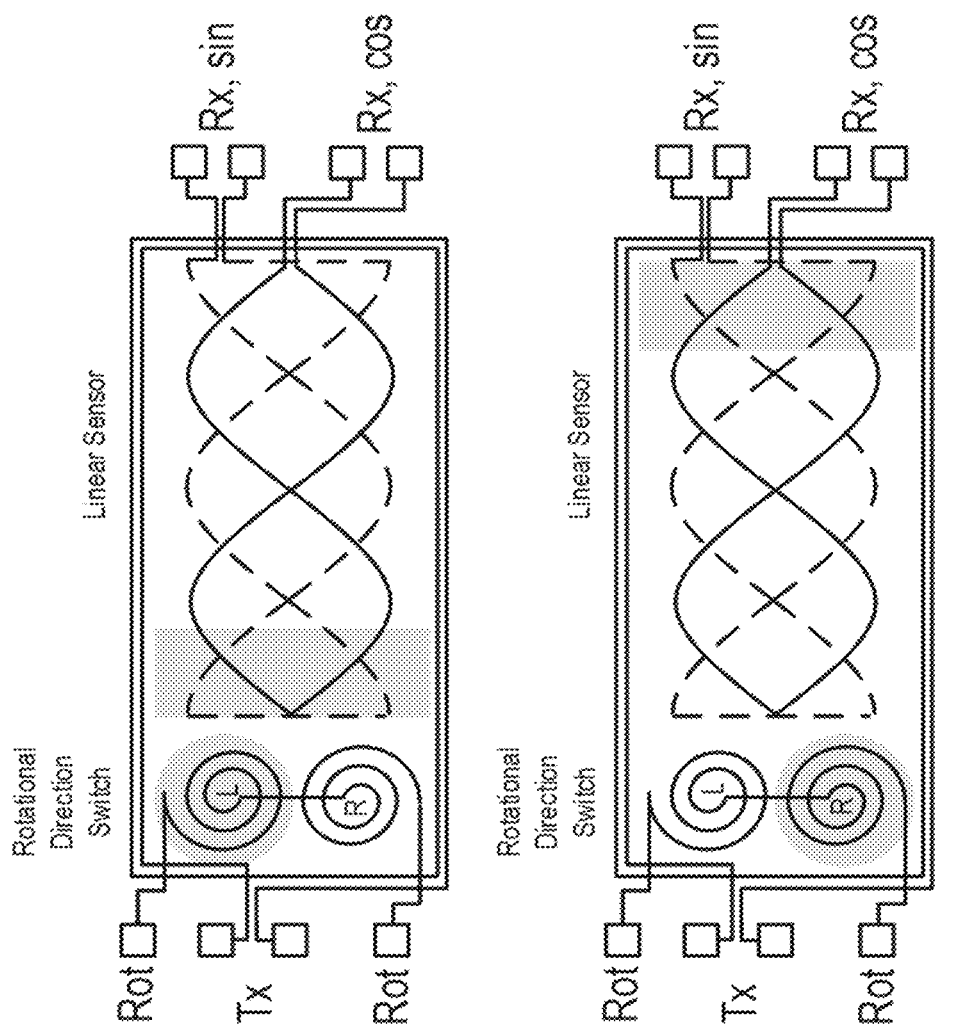

By suitably incorporating the multi-way switch as pro-posed above into the circuit structure/assembly as proposed with reference to FIGS. 5 to 8, more particularly within the open/reserved area, a finally complete design/implementa-tion of the trigger switch may be achieved, as illustratively shown now in FIG. 11. In particular, in the final design shown, all receiver coils (including coils "Rx, sin", "Rx, cos", "Rot, L" and "Rot, R") would be configured to pick up the magnetic field generated by the same, shared transmitter coil Tx. In other words, as can be seen from the examples of FIG. 11, the transmitter coil surrounds (and supports) all receiver coils. The third and fourth coils ("Rot, L" and "Rot, R") are independent of the first and second coils ("Rx, sin" and "Rx, cos"), and are responsible for the rotational direc-tion selection (e.g., clockwise-neutral-counterclockwise), as illustrated in detail earlier. For easy illustration and understanding, two simple examples are illustratively shown in FIG. 11. Therein, the upper diagram schematically illustrates a first possible example where the rotational direction switch is set to "L" (left) position (denoted by the round shade above the "L" coil), and the linear position sensor in the minimum position (denoted by the rectangular shade on the left). Similarly, the lower diagram schematically illustrates a second example where the rotational direction switch is set to "R" (right) position (denoted by the round shade above the "R" coil), and the linear position sensor in the maximum position (denoted by the rectangular shade on the right). Of course, as can be understood and appreciated by the skilled person, these examples are merely provided for illustrative purposes and should in no way be considered to constitute a limitation of any kind for the actual operations of the proposed trigger switch in practice.

Finally, a flowchart illustrating an example of a method 1200 of a circuit assembly is schematically shown in FIG. 12. The circuit assembly may be implemented in accordance with the possible embodiment as described above with respect to FIGS. 5 to 11, or the like, for example.

In particular, method 1200 may comprise, at step S1210, providing a transmitter coil and a plurality of receiver coils for receiving signals induced by a magnetic field generated by the transmitter coil. In particular, the plurality of receiver coils may comprise a first receiver coil which is a sine-signal-output receiver coil and a second receiver coil which is a cosine-signal-output receiver coil. Method 1200 may further comprise, at step S1220, providing one or more movable metallic targets for influencing the signals that are picked up by the plurality of receiver coils. Finally, method 1200 may comprise, at step S1230, displacing the transmitter coil and the first and second receiver coils from each other to have an open area in which the transmitter coil is present but not the first and second receiver coils. In particular, the open area may have a predetermined range along a movement path of a first target, such that when the first target moves within the predetermined range, the circuit assembly is operable in a first mode as a low power on-off switch; otherwise, the circuit assembly is operable in a second mode as an inductive position sensor.

Configured as proposed above, broadly speaking, the present disclosure generally seeks to replace incumbent contacting switches (and sometimes also the potentiometer), which may be prone to reliability issues from dust, vibration, moisture, etc. as discussed earlier, by a contactless, more reliable solution. More particularly, as proposed above, for the target movement in the predetermined range (e.g., the first 2-3 mm or the like), it may operate as a switch in a low power mode; while in the remaining travel path, it may operate with normal power as a linear position sensor. Thereby, when being implemented in a suitable device (e.g., a power tool, a remote controller, or the like), it may be made possible that, in standby (the first mode), e.g. when the trigger is released, the device can be ensured to be securely turned off, consuming as little power as possible but remaining checking whether the trigger is moving, to turn the device back on again once it has been pushed beyond a switching threshold; whilst in normal operation (the second mode), the speed (e.g., of the motor of the power tool) may be regulated through a linear position sensor. As will become apparent below, further functionality may be made possible as well, for example by incorporating further suitable receiver coil(s), such as that for possibly implementing the rotational direction switch as illustrated above. It may be worth noting that, the exemplary implementations using transmitter and receiver coils that may appear to have a specific wound, arrangement or placement as shown in the figures are merely provided for possible illustrative purposes, but are certainly not to be understood as a limitation of any kind. As can be understood and appreciated by the skilled person, any other suitable arrangement, implementation and/or application may be adopted.

It should be noted that the apparatus/device features described above correspond to respective method features that may however not be explicitly described, for reasons of conciseness. The disclosure of the present document is considered to extend also to such method features. In particular, the present disclosure is understood to also relate to methods of manufacturing and/or operating the circuits described above, and/or to providing and/or arranging respective elements of these circuits.

It is to be further noted that examples of embodiments of the disclosure are applicable to various applications or system configurations, depending on the underlying technical fields. In other words, the examples (such as the power tools) shown in the above-described figures, which are used as a basis for the above discussed examples, are only illustrative and do not limit the present disclosure in any way. That is, additional further existing and proposed new functionalities available in a corresponding operating environment may be used in connection with examples of embodiments of the present disclosure based on the principles defined.

It should also be noted that the disclosed example embodiments can be implemented in many ways using hardware and/or software configurations. For example, the disclosed embodiments may be implemented using dedicated hardware, dedicated software, and/or hardware in association with software executable thereon. The components and/or elements in the figures are examples only and do not limit the scope of use or functionality of any hardware, software in combination with hardware, firmware, embedded logic component, or a combination of two or more such components implementing particular embodiments of the present disclosure.

Finally, it should be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiments outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

The invention claimed is:

1. A circuit assembly comprising:

a transmitter coil and a plurality of receiver coils for receiving signals induced by a magnetic field generated by the transmitter coil; and one or more movable metallic targets for influencing the signals that are picked up by the plurality of receiver coils, wherein the plurality of receiver coils comprises a first receiver coil which is a sine-signal-output receiver coil and a second receiver coil which is a cosine-signal-output receiver coil; and the transmitter coil and the first and second receiver coils are displaced from each other to have an open area in which the transmitter coil is present but not the first and second receiver coils, the open area having a predetermined range along a movement path of a first target, such that when the first target moves within the predetermined range, the circuit assembly is operable in a first mode as a low power on-off switch; otherwise the circuit assembly is operable in a second mode as an inductive position sensor.

2. The circuit assembly according to claim 1, wherein the first receiver coil and the second receiver coil are arranged next to each other, one on top of another, or interleaved with each other.

3. The circuit assembly according to claim 1, wherein the predetermined range is determined based on a first predetermined threshold.

4. The circuit assembly according to claim 3, wherein when a magnitude of a signal of the second receiver coil is above the first threshold, the circuit assembly operates in the second mode.

5. The circuit assembly according to claim 1, wherein the circuit assembly operates in the second mode as long as a magnitude of signals of the first and second receiver coils is above a second predetermined threshold.

6. The circuit assembly according to claim 1, wherein in the first mode, the circuit assembly is configured to monitor only a signal picked up by the second receiver coil.

7. The circuit assembly according to claim 1, wherein in the second mode, the circuit assembly is configured to monitor signals picked up by both the first and second receiver coils for determining a position of the first target.

8. The circuit assembly according to claim 1, wherein the circuit assembly is configured to generate a first indicating signal and a second indicating signal, such that the first indicating signal is set to an 'ON' status when a magnitude of a signal of the second receiver coil is above a first threshold, otherwise the first indicating signal is set to an 'OFF' status; and the second indicating signal is set to an 'ON' status when a magnitude of signals of the first and second receiver coils is above a second predetermined threshold, otherwise the second indicating signal is set to an 'OFF' status.

9. The circuit assembly according to claim 8, wherein the circuit assembly operates in the first mode when both the first and second indicating signals are in the 'OFF' status, otherwise the circuit assembly operates in the second mode.

10. The circuit assembly according to claim 1, further comprising:

a second target and two anti-serially wound coils that are arranged next to each other in a movement direction of the second target within the open area, for implementing a switching position detection functionality.

11. The circuit assembly according to claim 10, wherein the switching position is detected based on a phase and/or a strength of a signal picked up by the two anti-serially wound coils due to movement of the second target relative to the two anti-serially wound coils.

12. The circuit assembly according to claim 10, wherein the switching position detection functionality is a three-way switch position detection functionality for detecting a first position where the second target is farther away from one coil of the two anti-serially wound coils, a second position where the second target is farther away from the other coil of the two anti-serially wound coils and a third position where the second target is substantially equidistant from the two anti-serially wound coils or covers neither of the two anti-serially wound coils;

the first position is detected by detecting a receiver signal being in phase with a transmitter signal and a level of the receiver signal being above a predefined threshold;

the second position is detected by detecting a receiver signal being 180° out of phase with a transmitter signal and a level of the receiver signal being above a predefined threshold; and the third position is detected by detecting a level of the receiver signal being below a predefined threshold.

13. The circuit assembly according to claim 1, wherein the circuit assembly is configured for implementing a contactless trigger switch.

14. An apparatus comprising the circuit assembly according to claim 1.

15. A method of a circuit assembly, comprising:

providing a transmitter coil and a plurality of receiver coils for receiving signals induced by a magnetic field generated by the transmitter coil; and providing one or more movable metallic targets for influencing the signals that are picked up by the plurality of receiver coils, wherein the plurality of receiver coils comprise a first receiver coil which is a sine-signal-output receiver coil and a second receiver coil which is a cosine-signal-output receiver coil; and wherein the method further comprises: displacing the transmitter coil and the first and second receiver coils from each other to have an open area in which the transmitter coil is present but not the first and second receiver coils, the open area having a predetermined range along a movement path of a first target, such that when the first target moves within the predetermined range, the circuit assembly is operable in a first mode as a low power on-off switch; otherwise the circuit assembly is operable in a second mode as an inductive position sensor.

* * * * *